(12) United States Patent
Maloney et al.

(10) Patent No.: US 7,716,992 B2
(45) Date of Patent: May 18, 2010

(54) SENSOR, METHOD, AND DESIGN STRUCTURE FOR A LOW-K DELAMINATION SENSOR

(75) Inventors: John J. Maloney, Essex Junction, VT (US); Wolfgang Sauter, Richmond, VT (US); Thomas A. Wassick, LaGrangeville, NY (US); Jeffrey S. Zimmerman, Swanton, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/056,627

(22) Filed: Mar. 27, 2008

(65) Prior Publication Data

US 2009/0246892 A1    Oct. 1, 2009

(51) Int. Cl.
*G01B 7/16* (2006.01)
(52) U.S. Cl. .......................... 73/777; 73/760
(58) Field of Classification Search ............ 73/777; 438/14–17
See application file for complete search history.

(56) References Cited

U.S. PATENT DOCUMENTS

| 5,814,729 | A | 9/1998 | Wu et al. | |
|---|---|---|---|---|
| 6,748,571 | B2 * | 6/2004 | Miwa | 716/4 |
| 7,026,175 | B2 * | 4/2006 | Li et al. | 438/14 |
| 7,202,475 | B1 * | 4/2007 | Testoni | 250/310 |
| 7,228,193 | B2 * | 6/2007 | Guldi et al. | 700/121 |
| 7,250,311 | B2 | 7/2007 | Aoki et al. | |
| 2005/0214956 | A1 * | 9/2005 | Li et al. | 438/14 |
| 2006/0205106 | A1 | 9/2006 | Fukuda et al. | |
| 2007/0046289 | A1 | 3/2007 | Troxler | |
| 2007/0062299 | A1 | 3/2007 | Mian et al. | |
| 2009/0201043 | A1 | 8/2009 | Kaltalioglu | |

OTHER PUBLICATIONS

Yeongshu Chen et al. "The Experimental Study for the Solder Joint Reliability of High I/O FCBGAs with Thermal Loaded Bend Test" Cont. on next line.
Sigmund et al., "Acoustic Microscopy of Flip Chip Packages," Pan Pacific Microelectronics Symposium, 1999, pp. 52-54.
Chen et al., "The Experimental Study for the Solder Joint Reliability of High I/O FCBGAs with Thermal Loaded Bend Test," IEEE Transactions on Components and Packaging Technologies, vol. 29, No. 1, Mar. 2006, pp. 198-203.

* cited by examiner

*Primary Examiner*—Max Noori
(74) *Attorney, Agent, or Firm*—Anthony J. Canale; Greenblum & Bernstein P.L.C.

(57) ABSTRACT

The invention generally relates to a design structure of a circuit design, and more particularly to a design structure of a delamination sensor for use with low-k materials. A delamination sensor includes at least one first sensor formed in a layered semiconductor structure and a second sensor formed in the layered semiconductor structure. The at least one first sensor is structured and arranged to detect a defect, and the second sensor is structured and arranged to identify an interface where the defect exists.

19 Claims, 7 Drawing Sheets

US 7,716,992 B2

SENSOR, METHOD, AND DESIGN STRUCTURE FOR A LOW-K DELAMINATION SENSOR

FIELD OF THE INVENTION

The invention generally relates to a design structure of a circuit design, and more particularly to a design structure of a delamination sensor for use with low-k materials. The invention also relates to a delamination sensor and a method of using a delamination sensor.

BACKGROUND OF THE INVENTION

Semiconductor device manufacturing methods often employ back end of line (BEOL) processes to add interconnect wiring to integrated circuit (IC) devices. For example, in numerous applications, multiple layers of dielectric material (often referred to as interlayer dielectric, or ILD) are formed on a chip. The layers of dielectric material are patterned and etched to form trenches that are later filled with conducting material (e.g., copper) to form vias and wires that connect devices (e.g., RAM) in the chip to other components (e.g., motherboard). Conventional high speed chips may have as many as five to ten wiring layers.

Historically, dense metal oxides such as, for example, silicon dioxide ($SiO_2$), have been used as the dielectric material in interconnect structures. While $SiO_2$ is an excellent insulator with high modulus and hardness, and has a coefficient of thermal expansion (CTE) close to silicon, the dielectric constant (k) is approximately 4.0, which is too high for advanced generation interconnects. High-dielectric constants for ILD materials result in signal charging and propagation delays as well as increased transistor power budgets in the circuits that make up the IC. These circuit delays and power requirements are becoming an issue relative to improving the performance of IC chips. As such, device manufacturers are migrating toward the use of low-k (e.g., k<3.0) dielectric materials (such as, for example, inorganic polymers, organic polymers such as polyamides, spin-on glasses, silsesquioxane-based materials, etc.). Generally speaking, low-k dielectric materials serve to increase the speed of the conducting wires, thereby increasing the speed of the semiconductor device.

However, one concern of integrating low-k dielectric materials into the wafer BEOL is the delamination stresses that occur when the chip is packaged. The delamination of the chip in the low-k dielectric material layers due to their weaker mechanical properties (e.g., modulus and adhesion) may result in failure of the package.

Stresses are imparted to the chip due to differences in CTE between the chip and the different materials used in semiconductor packaging. For example, a Silicon chip has a relatively low CTE, while an organic carrier that the low-k chip is disposed upon may have a relatively high CTE. Also, each wiring level may be composed of a different low-k dielectric material, each having differing coefficients of thermal expansion. When the chip is assembled to an organic carrier at an elevated temperature and subsequently cooled, and when a chip undergoes thermal cycling during reliability testing, the differences in CTE between adjacent layers cause stresses at the interface between the layers.

These stresses can lead to structural damage of the chip, including cracks in individual layers and delamination between adjacent layers. Structural damage, in turn, renders a chip unusable, thereby decreasing yield and posing a reliability risk.

In the early stages of technology development, low-k dielectric material delamination is a problem that typically affects a large number of modules. In order to determine the failing interfaces, destructive failure analysis is often performed. However, destructive failure analysis has become a very fine art and is difficult, slow, and costly.

Accordingly, there exists a need in the art to overcome the deficiencies and limitations described hereinabove.

SUMMARY OF THE INVENTION

In a first aspect of the invention, there is a delamination sensor comprising at least one first sensor formed in a layered semiconductor structure and a second sensor formed in the layered semiconductor structure. The at least one first sensor is structured and arranged to detect a defect, and the second sensor is structured and arranged to identify an interface where the defect exists.

In another aspect of the invention, there is a design structure embodied in a machine readable medium for designing, manufacturing, or testing an integrated circuit, the design structure comprising at least one first sensor formed in a layered semiconductor structure and a second sensor formed in the layered semiconductor structure. The at least one first sensor is structured and arranged to detect a defect, and the second sensor is structured and arranged to identify an interface where the defect exists.

In an additional aspect of the invention, there is a method comprising detecting, using a first sensor, a location of a defect within a footprint of the semiconductor structure. The method also includes detecting, using a second sensor, an interface between two respective layers of the semiconductor structure at which the defect exists.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF EMBODIMENTS OF THE INVENTION

The invention generally relates to a design structure of a circuit design, and more particularly to a design structure of a delamination sensor for use with low-k materials. The invention also relates to a delamination sensor and a method of using a delamination sensor. In implementations of the invention, a first type of sensor is provided to determine a location within the footprint of a layered semiconductor device at which a delamination occurs, while a second type of sensor is provided for determining which of the layers the delamination occurs between. In this manner, implementations of the invention provide for determining a precise location of a delamination without having to resort to costly destructive failure analysis.

Figure 1:
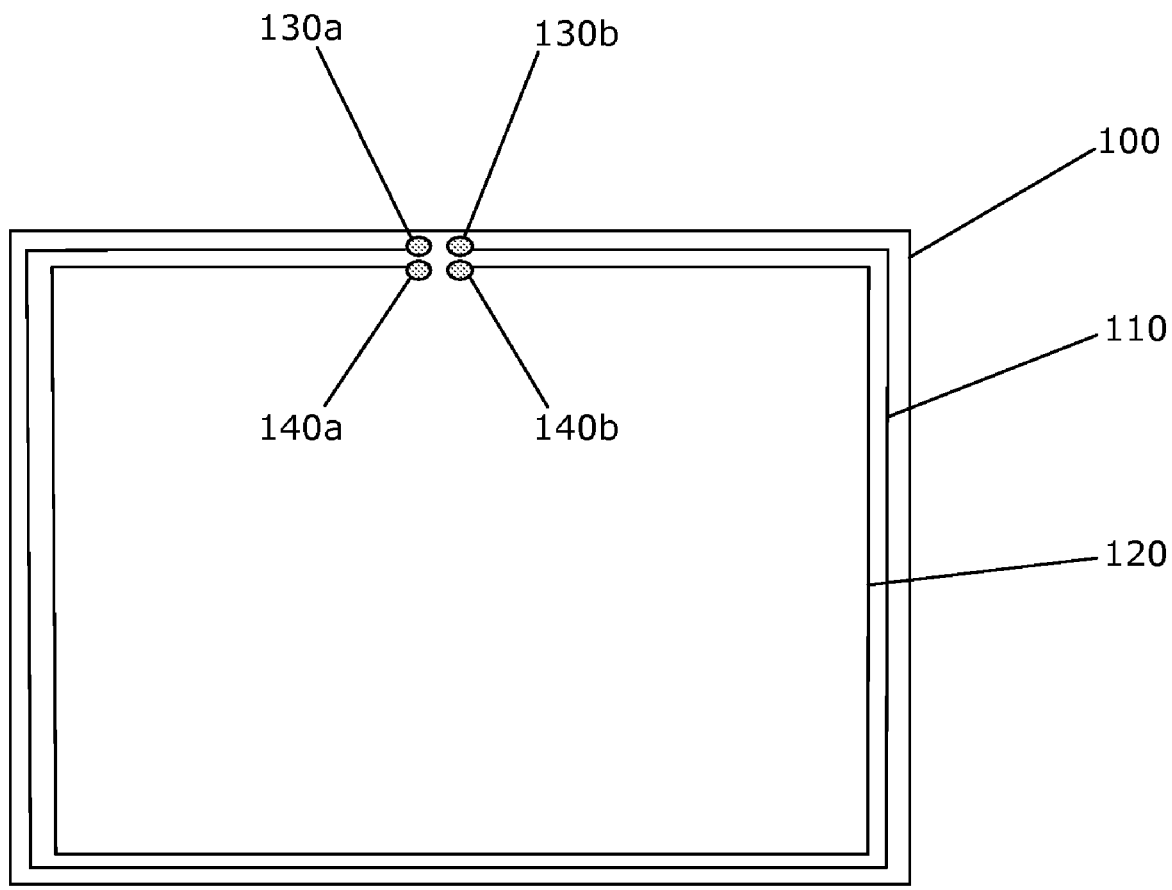
FIG. 1 shows a circuit design for detecting a crack.

FIG. 1 shows a wiring diagram for detecting a crack in a level of a chip. More specifically, element 100 represents a wiring level of a chip, such as, for example, a layer of low-k dielectric material. Embedded within layer 100 are first wire 110 and second wire 120 that extend substantially around the perimeter of the chip. The wires are formed in a conventional manner, such as, for example, patterning and etching the layer 100 to form trenches, and then filling the trenches with electrically conductive material (e.g., copper). Forming wires in a layer of dielectric material is known, such that further explanation is not believed necessary.

First electrical contacts 130a, 130b such as, for example, solder balls, are disposed at the ends of the first wire 110. Likewise, second electrical contacts 140a, 140b are disposed at the ends of second wire 120. The continuity of the first wire 110 can be determined by measuring the electrical continuity between the first electrical contacts 130a and 130b. If there is electrical continuity between the first contacts 130a and 130b, it can be inferred that the first wire 110 is unbroken. However, if there is a lack of continuity between the contacts 130a and 130b, then it can be inferred that the first wire is broken (e.g., by structural damage, such as a crack, in the level 100). Measuring electrical continuity is known, such that further explanation is not believed necessary.

Similarly, leakage between the first wire 110 and second wire 120 can be determined by monitoring the continuity between appropriate pairs of contacts 130a, 130b, 140a and 140b in a known manner. Leakage between the first wire 110 and second wire 120 is also indicative of structural damage to the material of the level 100. Measuring leakage is known, such that further explanation is not believed necessary.

When each level of dielectric material of a chip is provided with the wiring structure shown in FIG. 1, it is possible to determine when certain types of physical damage (i.e., cracks) occur in a respective level. However, the structure shown in FIG. 1 cannot be used to identify a precise location (e.g., an x-y coordinate within the footprint of the chip) where the damage exists. Moreover, the structure in FIG. 1 is not useful for detecting delamination(s) between levels (e.g., at the interface of adjacent levels).

Figure 2:
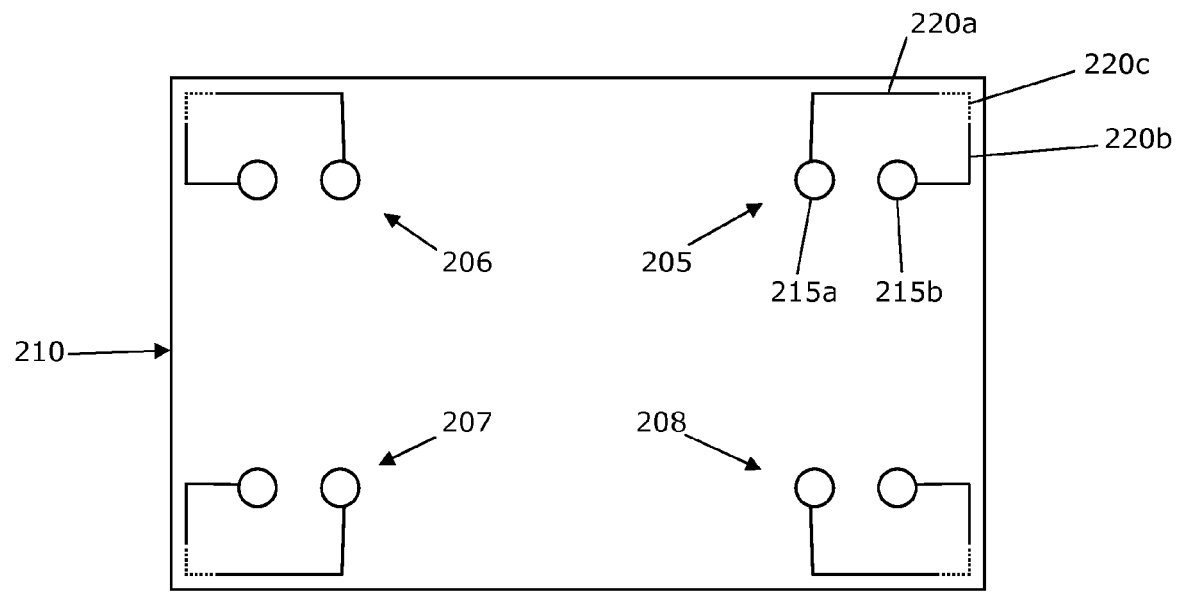
FIG. 2 shows a top view of a wiring design according to aspects of the invention.
Figure 3:
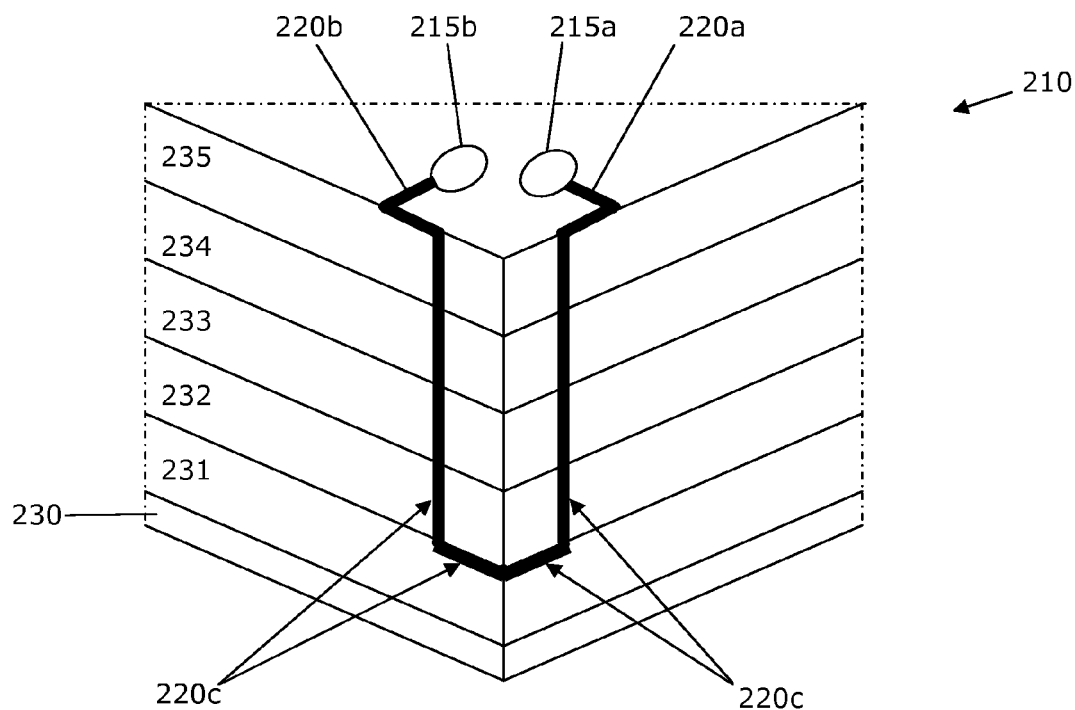
FIG. 3 shows a partial (e.g., cutaway) view of a portion of the structure shown in FIG. 2.

FIGS. 2 and 3 show exemplary embodiments of delamination sensors 205, 206, 207, 208 according to aspects of the invention. More specifically, FIG. 2 shows a top view (e.g., a footprint) of a semiconductor structure (e.g., chip) 210, which may comprise, for example, a semiconductor structure made up of plural layers of low-k dielectric material. However, the invention is not limited to use with low-k dielectric material, but rather implementations of the invention can be used with any laminated structure.

In embodiments, the sensors (e.g., 205-208) are referred to as position sensors, because they are usable to determine a location of a defect (e.g., damage to the chip) within the footprint of the chip. More specifically, in embodiments, each of the position sensors is associated with an x-y location in the footprint of the semiconductor structure. This association may be stored, for example, as data in a computing device. When a defect is detected by a particular position sensor, the x-y location associated with that position sensor, and consequently of the defect, is retrieved.

In preferred embodiments, the sensors 205-208 are arranged at or near the corners of the chip 210. This is because delaminations often begin at or near the corners of structures. However, the invention is not limited to sensors arranged at corners; instead, in implementations of the invention, a sensor can be located at any desired location within the footprint of the chip. Moreover, while the chip 210 is shown as rectangular, the invention is not limited to semiconductor structures having this shape, and any shape of chip may be used within the scope of the invention.

Sensors 205-208 are substantially identical, such that only one (sensor 205) will be described in detail. In embodiments, sensor 205 includes first and second contacts 215a, 215b formed in the top layer of low-k dielectric material. The contacts may comprise, for example, "C4" solder balls, which are known in the art such that further explanation is not believed necessary.

Sensor 205 further includes a continuous wire path made up of a first wire portion 220a formed in the upper layer of low-k dielectric material and connected to the first contact 215a; a second wire portion 220b formed in the upper layer of low-k dielectric material and connected to the second contact 215b; and a third wire portion 220c that is connected to the first wire portion 220a and second wire portion 220b and that also extends downward through the multiple layers of low-k dielectric material.

For example, as depicted in FIG. 3, the chip 210 may comprise a silicon-based wafer 230 having suitable devices arranged therein, and plural (e.g., five) layers 231-235 of low-k dielectric material formed on the wafer 230. The contacts 215a, 215b, first wire portion 220a, and second wire portion 220b are formed in the uppermost layer (e.g., fifth layer 235). The third wire portion 220c is connected to the first wire portion 230 in the uppermost layer 235, extends downward through the layers 235, 234, 233, 232, and at least into layer 231, and extends back up through the same layers to come into contact with second wire portion 220b in the top layer 235.

In this manner, a continuous wire that traverses the interfaces between the various layers 231-235 is formed between the contacts 215a, 215b. The structural integrity of the wire can be determined by monitoring the continuity between the contacts 215a, 215b. When there is continuity between the contacts 215a, 215b, it can be inferred that no significant delamination has occurred between any two of the levels 231-235. However, when there is a lack of continuity between the contacts 215a, 215b, it can be inferred that the wire is discontinuous (e.g., broken by a delamination between two respective layers).

In embodiments, the wire portions 220a-c are formed of copper, although any suitable conductive material may be used within the scope of the invention. Moreover, the wire portions 220a-c may be of any suitable shape having any desired dimensions (e.g., length, cross-sectional area, etc.) In preferred embodiments, the material(s) and dimensions of the wire portions 220a-c are chosen such that the overall resistance of the circuit (220a-220b-220c) is in the range of about 10 Ohm to about 10 kOhm.

While the sensors 205-208 are useful for determining that a delamination has occurred at a particular corner (or other location within the footprint of the chip), these sensors 205-208 do not provide information as to which respective levels a delamination is between. Accordingly, FIG. 4 shows a second type of sensor arrangement (different from the positions sensors 205-208) that operates to determine the interface at which a delamination occurs.

Figure 4:
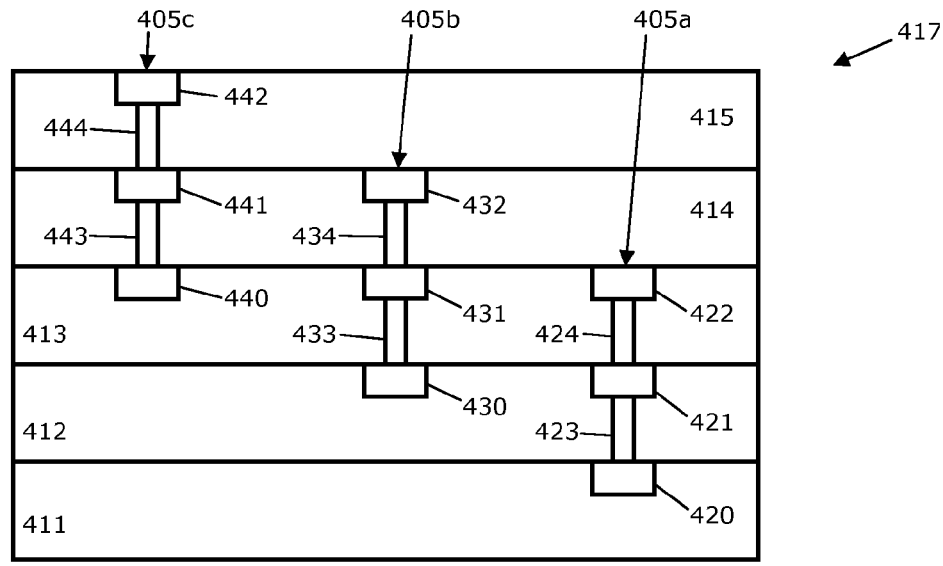
FIG. 4 shows a diagram of via chains in levels of a semiconductor device according to aspects of the invention.

More specifically, FIG. 4 shows a group of via chains, including first via chain 405a, second via chain 405b, and third via chain 405c. In embodiments, the via chains 405a-c are composed of wires and vias (e.g., electrically conductive material) embedded in respective layers 411-415 of a semiconductor structure 417.

For example, first via chain 405a may comprise a first wire 420 in the first level 411, a second wire 421 in the second level 412, and a third wire 422 in the third level 413. A first via 423 connects the first wire 420 to the second wire 421, while a second via 424 connects the second wire 421 to the third wire 422. Similarly, second via chain 405b includes a first wire 430, second wire 431, third wire 432, first via 433, and second via 434 arranged in the second level 412, third level 413, and fourth level 414. Likewise, third via chain 405c includes a first wire 440, second wire 441, third wire 442, first via 443, and second via 444 arranged in the third level 413, fourth level 414, and fifth level 415.

In embodiments, the via chains 405a-c are not electrically connected to one another. In further embodiments, appropriate contact structures (e.g., solder balls) are provided for measuring/detecting the electrical continuity of each respective via chain 405a-c. Moreover, while three via chains 405a-c and five levels 411-415 are shown, the invention is not limited to this structure; rather, any suitable number of via chains and levels may be used within the scope of the invention.

Because each respective via chain spans a unique grouping of levels, the interface between levels at which a delamination occurs can be determined by detecting and comparing the continuities of the via chains 405a-c. For example, if a delamination occurs between the first level 411 and the second level 412, then the first via chain 405a would be discontinuous (e.g., broken) while the second via chain 405b and the third via chain 405c remain continuous (e.g., unbroken). As such, when the first via chain 405a is detected as discontinuous while the second and third via chains 405b, 405c are detected as continuous, it can be inferred that there is a delamination at the interface between the first level 411 and the second level 412. Similarly, if the first and second via chains 405a, 405b are detected as discontinuous while the third via chain 405c is detected as continuous, then it can be inferred that there is a delamination at the interface between the second level 412 and the third level 413. In this manner, each unique combination of the continuity/discontinuity of the respective via chains 405a-405c corresponds to a delamination at a particular interface between two respective ones of levels 411-415.

Figure 5:
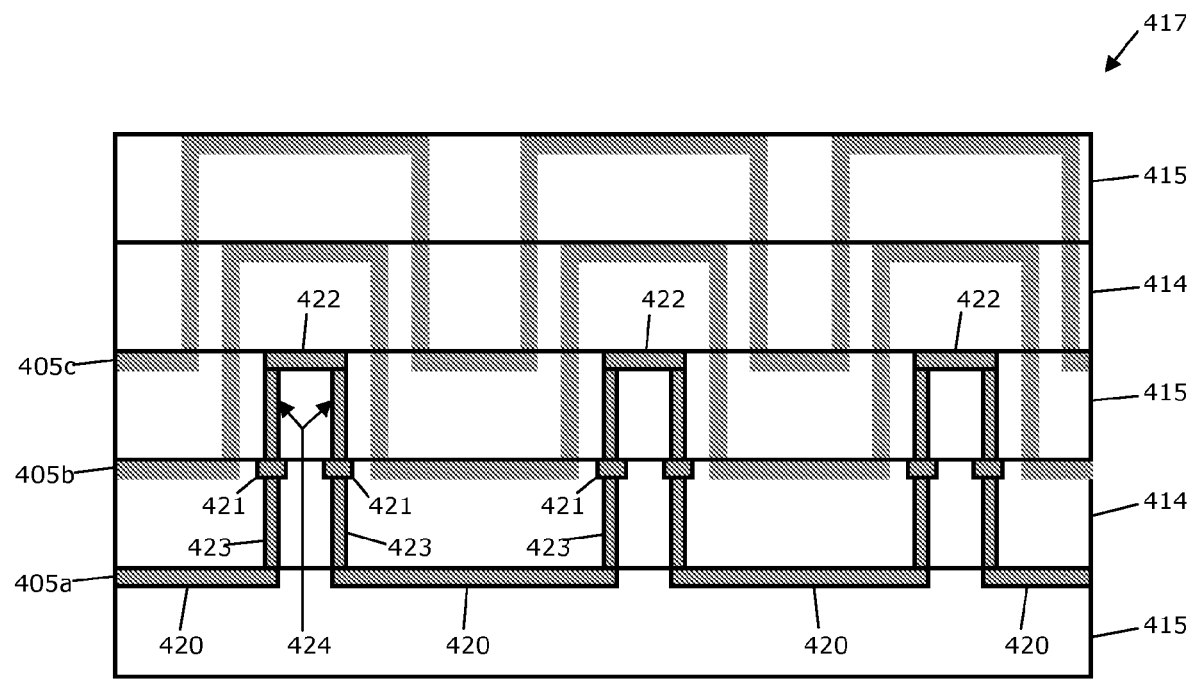
FIG. 5 shows another diagram of via chains in levels of a semiconductor device according to aspects of the invention.

In embodiments, each via chain 405a-c repeatedly extends up and down through its group of layers along the side edges of the chip 417. For example, as depicted in FIG. 5 which is a diagrammatic side view of chip 417, the first via chain 405a is arranged along the side edge of the chip 417 while extending up and down amongst the first, second, and third levels 411-413. For simplicity, only the wires (420-422) and vias (423-424) of the first via chain 405a are identified. However, as is readily apparent from the drawings, the second via chain 405b extends in a similar fashion up and down between the second, third, and fourth levels 412-414, and the third via chain 405c extends up and down between the third, fourth, and fifth levels 413-415. In this manner, via chains according to aspects of the invention can be formed at or near the perimeter of the chip.

Figure 6:
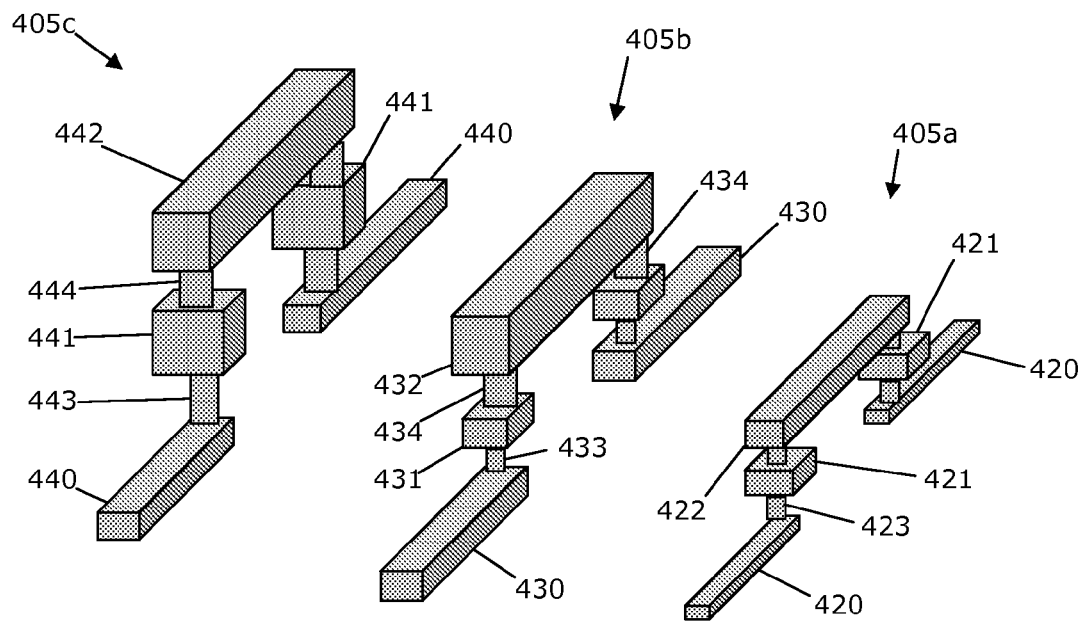
FIG. 6 shows portions of via chains according to aspects of the invention.

FIG. 6 shows an isometric view of exemplary portions of via chains 405a-405c outside of (e.g., not embedded in) the layers of the semiconductor structure. In embodiments, the parameters (e.g., material, length, cross-sectional area, etc.) of each via chain are chosen to provide a total resistance of about 10 kOhm, although any suitable resistance may be used within the scope of the invention.

Figure 7:
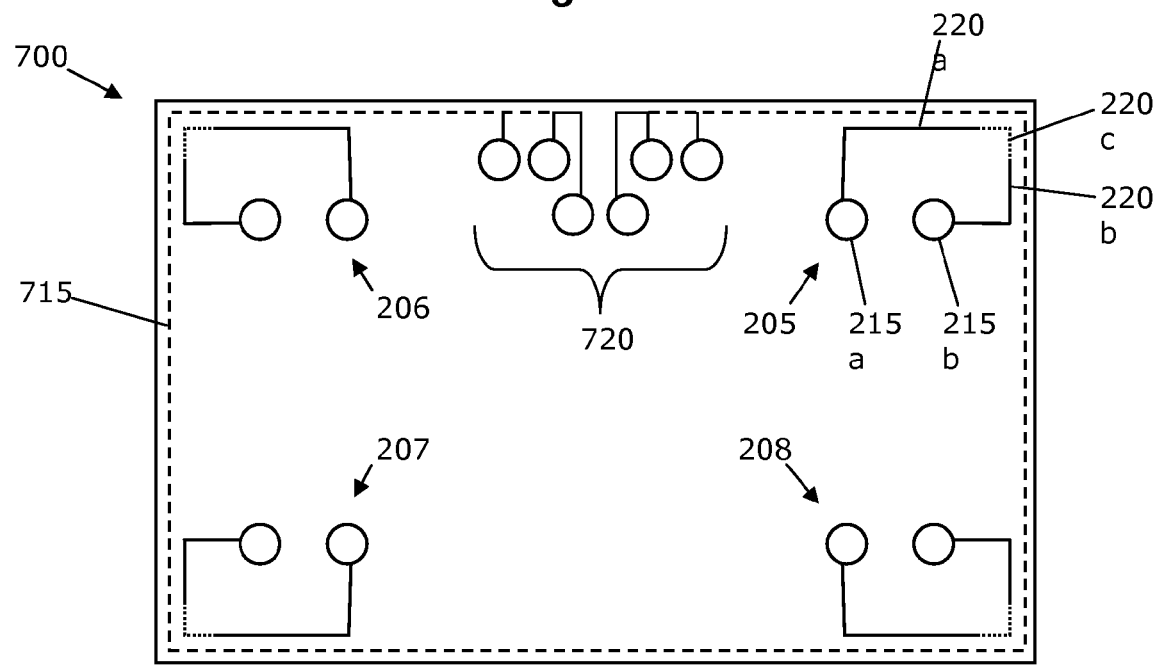
FIG. 7 shows a top view of a combination of sensors according to aspects of the invention.

FIG. 7 shows a top view of an exemplary semiconductor structure 700 having a combination of position sensors (such as those described with respect to FIGS. 2-3) and via chains (such as those described with respect to FIGS. 4-6). For example, the semiconductor structure 700 may comprise four position sensors 205-208, each including two contacts 215a, 215b and wire portions 220a-c. Plural via chains 405a-c are collectively depicted by dashed line 715. Each via chain is connected to two respective ones of the contacts 720 (which may be similar to contacts 215a, 215b). In the example depicted, semiconductor structure 700 includes five wiring layers, such that three via chains are utilized, resulting in a total of six contacts 720. The invention is not limited to the exemplary configuration shown in FIG. 7. For example, more (or fewer) position sensors can be employed with the invention, and the position sensors may be located anywhere within the footprint of the semiconductor structure 700 (e.g., not just at the corners). Similarly, more (or fewer) via chains can be employed within the scope of the invention, and the via chains may be located anywhere within the footprint.

By utilizing a combination of position sensors and via chains, embodiments of the invention provide the ability to detect a delamination at a particular corner, and also to determine the interface (e.g., between two layers) at which the delamination occurs. In this manner, implementations of the invention can be used to analyze chip failures in lieu of costly destructive failure analysis.

PROCESSES OF THE INVENTION

Figure 8:
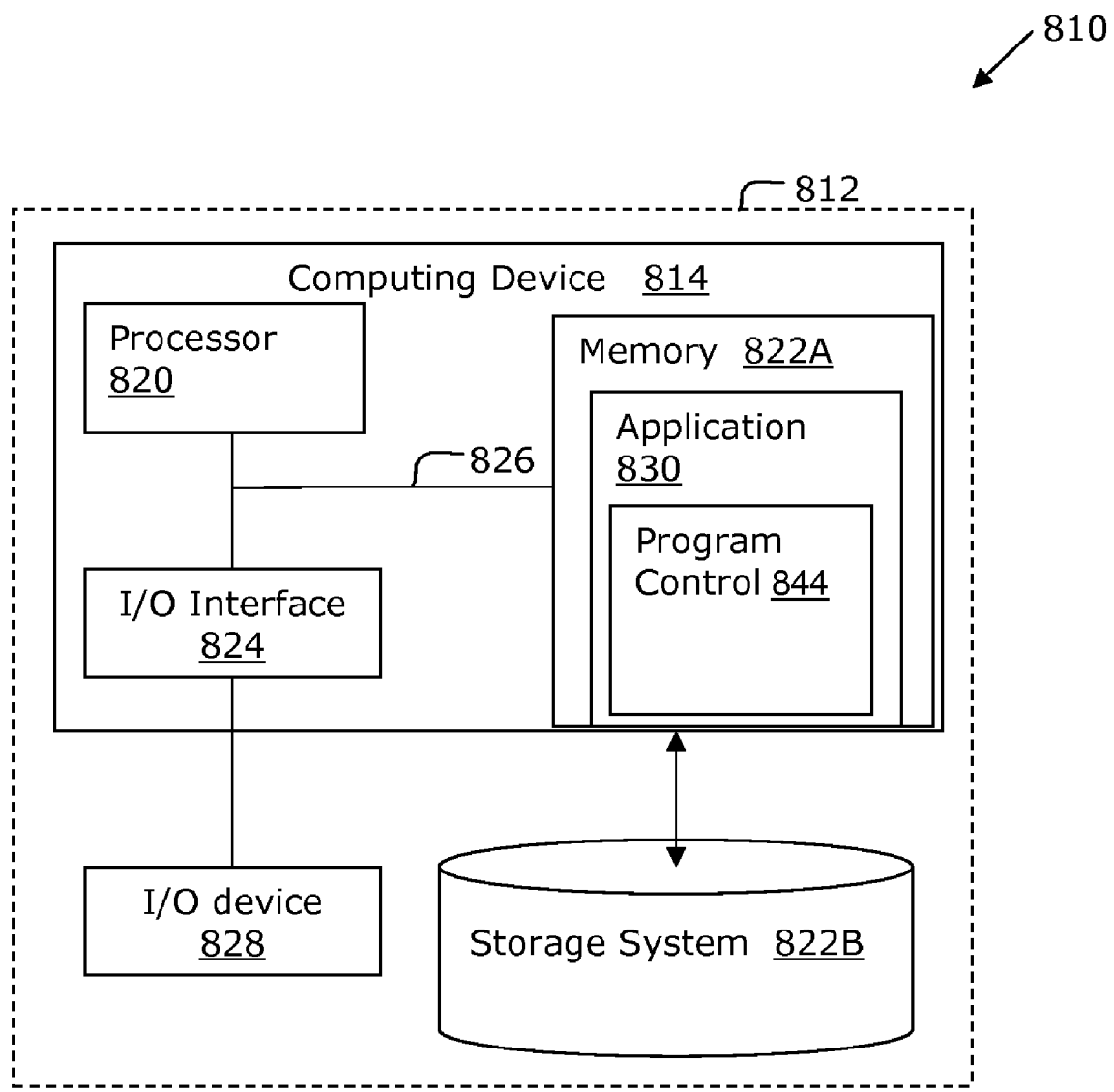
FIG. 8 shows an illustrative environment for implementing the steps in accordance with the invention.

FIG. 8 shows an illustrative environment 810 for managing the processes in accordance with the invention. To this extent, the environment 810 includes a computer infrastructure 812 that can perform the processes described herein. In particular, the computer infrastructure 812 includes a computing device 814 that comprises an application 830 having a program control 844, which makes the computing device 814 operable to perform the processes described herein, such as, for example, detecting delamination in a semiconductor structure.

The computing device 814 includes a processor 820, a memory 822A, an input/output (I/O) interface 824, and a bus 826. The memory 822A can include local memory employed during actual execution of program code, bulk storage, and cache memories which provide temporary storage of at least some program code (e.g., program control 844) in order to reduce the number of times code must be retrieved from bulk storage during execution. Further, the computing device 814 is in communication with an external I/O device/resource 828 and a storage system 822B. The I/O device 828 can comprise any device that enables an individual to interact with the computing device 814 or any device that enables the computing device 814 to communicate with one or more other computing devices using any type of communications link. The external I/O device/resource 828 may be keyboards, displays, pointing devices, etc.

The processor 820 executes computer program code (e.g., program control 844), which is stored in memory 822A and/or storage system 822B. While executing computer program code, the processor 820 can read and/or write data to/from memory 822A, storage system 822B, and/or I/O interface 824. The bus 826 provides a communications link between each of the components in the computing device 814.

The computing device 814 can comprise any general purpose computing article of manufacture capable of executing computer program code installed thereon (e.g., a personal computer, server, wireless notebook, smart phone, personal digital assistant, etc.). However, it is understood that the computing device 814 is only representative of various possible equivalent computing devices that may perform the processes described herein. To this extent, in embodiments, the functionality provided by the computing device 814 can be implemented by a computing article of manufacture that includes any combination of general and/or specific purpose hardware and/or computer program code. In each embodiment, the program code and hardware can be created using standard programming and engineering techniques, respectively.

Similarly, the computer infrastructure 812 is only illustrative of various types of computer infrastructures for implementing the invention. For example, in embodiments, the computer infrastructure 812 comprises two or more computing devices (e.g., a server cluster) that communicate over any type of communications link, such as a network, a shared memory, or the like, to perform the processes described herein. Further, while performing the processes described herein, one or more computing devices in the computer infrastructure 812 can communicate with one or more other computing devices external to computer infrastructure 812 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

The steps of the flow diagrams described herein may be implemented in the environment of FIG. 8. The flow diagrams may equally represent a high-level block diagram of the invention. The steps of the flow diagrams may be implemented and executed from a server, in a client-server relationship, by computing devices in an ad hoc network, or they may run on a user workstation with operative information conveyed to the user workstation. Additionally, the invention can take the form of an entirely hardware embodiment, an entirely software embodiment or an embodiment containing both hardware and software elements. In an embodiment, the software elements include firmware, resident software, microcode, etc.

Furthermore, the invention can take the form of a computer program product accessible from a computer-usable or computer-readable medium providing program code for use by or in connection with a computer or any instruction execution system. The software and/or computer program product can be implemented in the environment of FIG. 8. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

Figure 9:
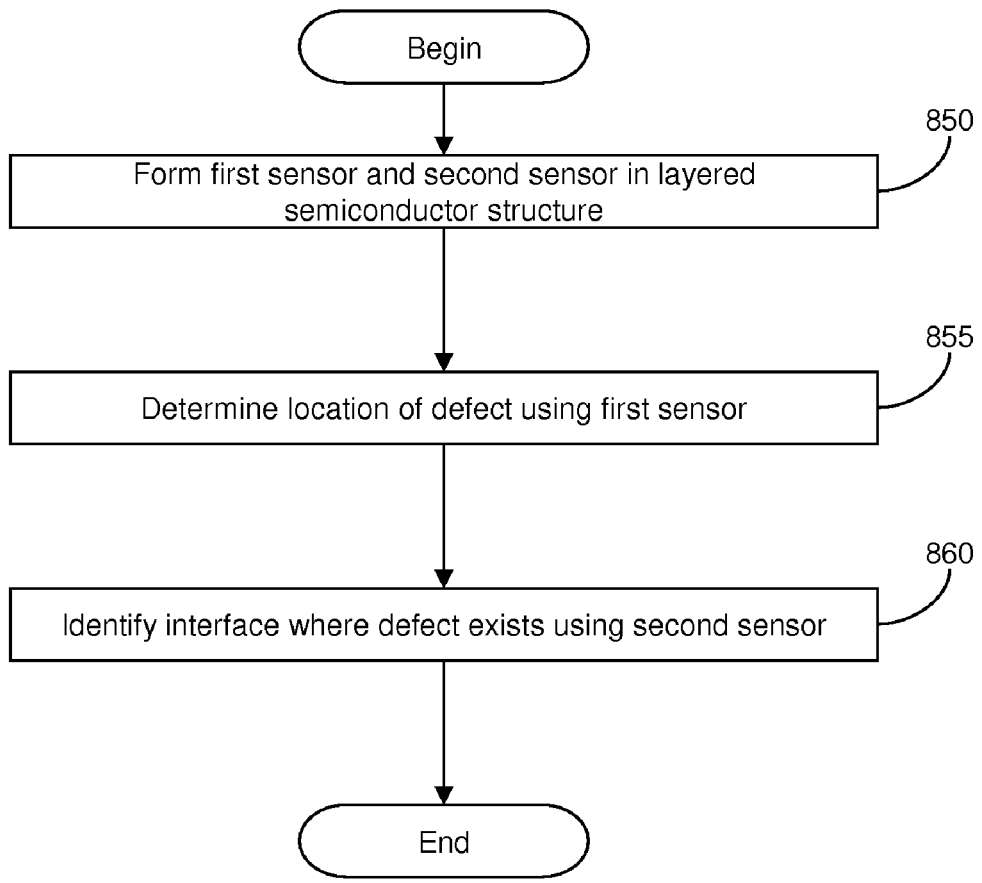
FIG. 9 shows a flow diagram depicting implementations of a method according to aspects of the invention.

FIG. 9 shows a flow diagram depicting steps of a method according to aspects of the invention. At step 850, first and second sensors are formed in a layered semiconductor structure. In embodiments, the first sensor comprises at least one position sensor (such as that described above with respect to FIGS. 2, 3, and 7), and the second sensor comprises a plurality of via chains (such as those described with respect to FIGS. 4-7). The layered semiconductor structure may comprise a semiconductor wafer with a plurality of wiring levels (e.g., layers) of dielectric material formed thereon. The sensors formed in step 850 may be formed using conventional fabrication techniques.

At step 855, a location of a defect within the footprint of the semiconductor structure is determined using the first sensor. In embodiments, each of the at least one position sensors is associated with an x-y location in the footprint of the semiconductor structure. This association may be stored, for example, as data in a computing device such as that described in FIG. 8.

In embodiments, the determining in step 855 comprises detecting (e.g., monitoring) the continuity of each one of the respective at least one position sensors. The detecting can be performed, for example, using a computing device such as that described in FIG. 8. When a discontinuity is detected in a particular position sensor, the x-y location associated with that position sensor is retrieved.

Step 860 comprises identifying an interface between two layers of the semiconductor structure at which the defect is located. In embodiments, this is accomplished by detecting and comparing the continuity of the plurality of via chains using, for example, a computing device such as that described in FIG. 8. In implementations of the invention, steps 855-860 are performed to precisely locate a delamination in a layered semiconductor structure.

Figure 10:
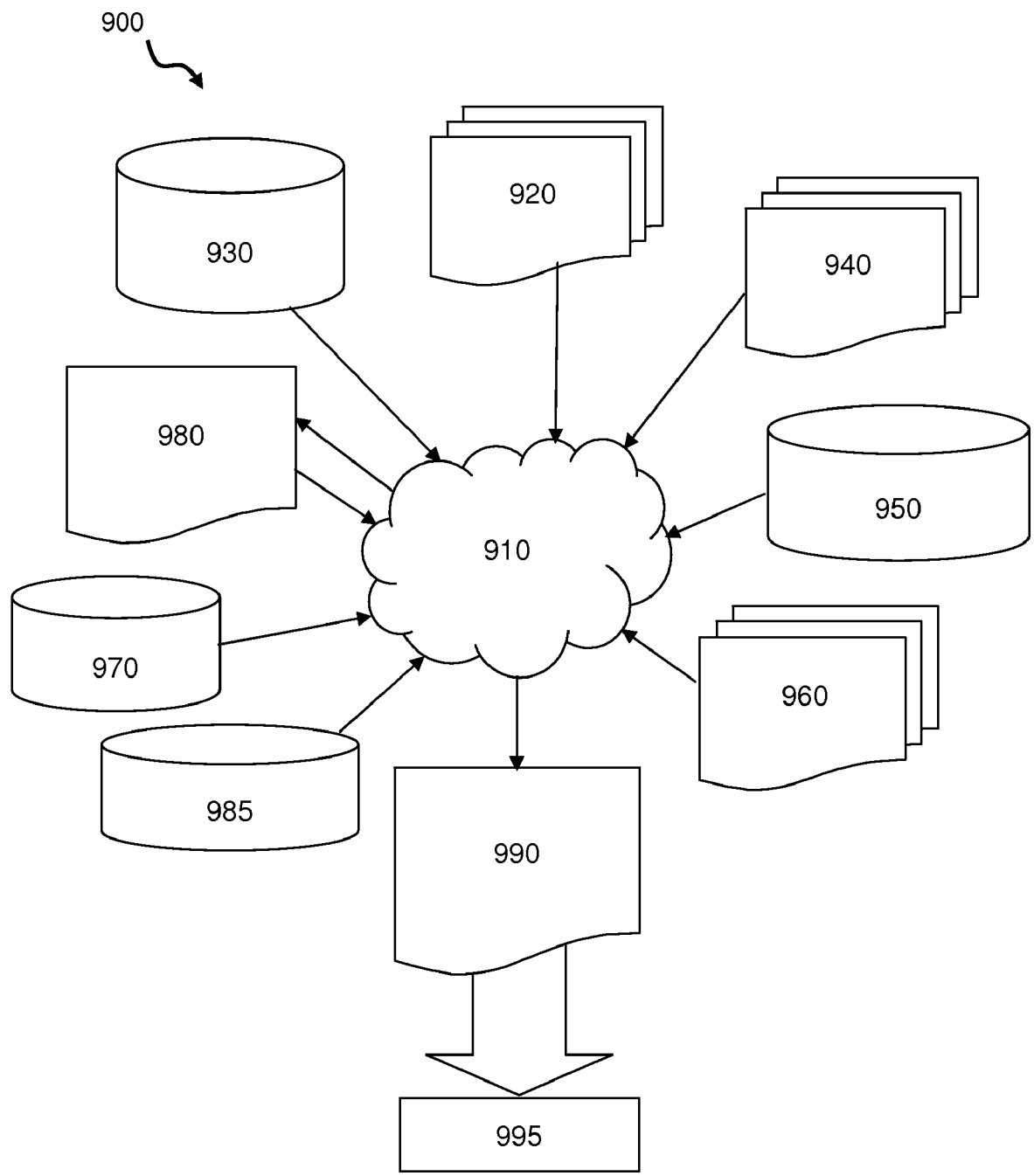
FIG. 10 is a flow diagram of a design process used in semiconductor design, manufacturing, and/or test.

FIG. 10 shows a block diagram of an example design flow 900. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises an embodiment of the invention as shown in FIGS. 2-7 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in FIGS. 2-7. Design process 910 preferably synthesizes (or translates) an embodiment of the invention as shown in FIGS. 2-7 into a netlist 980, where netlist 980 is, for example, a list of wires, transistors, logic gates, control circuits, I/O, models, etc. that describes the connections to other elements and circuits in an integrated circuit design and recorded on at least one of machine readable medium. This may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 2-7, along with the rest of the integrated circuit design (if applicable), into a final design structure 990. Design structure 990 resides on a storage medium in a data format used for the exchange of layout data of integrated circuits and/or symbolic data format (e.g., information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 2-7. Design structure 990 may then proceed to a stage 995 where, for example, design structure 990: proceeds to tape-out, is released to manufacturing, is released to a mask house, is sent to another design house, is sent back to the customer, etc.

While the invention has been described in terms of embodiments, those skilled in the art will recognize that the invention can be practiced with modifications and in the spirit and scope of the appended claims.

What is claimed is:

1. A delamination sensor, comprising:
   at least one first sensor formed in a layered semiconductor structure; and
   a second sensor formed in the layered semiconductor structure;
   wherein the at least one first sensor is structured and arranged to detect a defect, and
   the second sensor is structured and arranged to identify an interface where the defect exists.

2. The delamination sensor of claim 1, wherein the layered semiconductor structure comprises a wafer and a plurality of layers of dielectric material formed on the wafer, and
   the defect comprises a delamination of respective ones of the plurality of layers.

3. The delamination sensor of claim 2, wherein the plurality of layers of dielectric material comprise low-k dielectric material.

4. The delamination sensor of claim 1, wherein the at least one first sensor comprises a plurality of position sensors located at respective corners of the layered semiconductor structure, and
   the second sensor comprises a plurality of via chains.

5. The delamination sensor of claim 4, wherein each respective one of the plurality of via chains spans a unique group of layers of the layered semiconductor structure.

6. The delamination sensor of claim 4, wherein the plurality of position sensors and the plurality of via chains comprise copper in portions of the layered semiconductor structure.

7. The delamination sensor of claim 1, wherein the at least one first sensor comprises an electrical circuit.

8. The delamination sensor of claim 7, wherein the second sensor comprises a plurality of electrically conductive via chains.

9. The delamination sensor of claim 8, wherein:
   an electrical continuity of the electrical circuit is detectable for determining a position of the defect within a footprint of the layered semiconductor structure, and
   electrical continuities of respective ones of the plurality of via chains are detectable and comparable for identifying the interface.

10. The delamination sensor of claim 8, further comprising a computing device structured and arranged to:
    measure a continuity of the electrical circuit; and
    measure and compare continuities of the plurality of via chains.

11. The delamination sensor of claim 8, wherein the electrical circuit has a resistance of about 10 Ohm to about 10 kOhm.

12. A design structure embodied in a machine readable medium for designing, manufacturing, or testing an integrated circuit, the design structure comprising:
    at least one first sensor formed in a layered semiconductor structure; and
    a second sensor formed in the layered semiconductor structure;
    wherein the at least one first sensor is structured and arranged to detect a defect, and
    the second sensor is structured and arranged to identify an interface between respective layers where the defect exists.

13. The design structure of claim 12, wherein the design structure comprises a netlist.

14. The design structure of claim 12, wherein the design structure resides on a storage medium as a data format used for the exchange of layout data of integrated circuits.

15. The design structure of claim 12, wherein the design structure includes at least one item selected from the group consisting of test data files, characterization data, verification data, and design specifications.

16. A method, comprising:
    detecting, using a first sensor, a location of a defect within a footprint of a semiconductor structure; and
    detecting, using a second sensor, an interface between two respective layers of the semiconductor structure at which the defect exists wherein the second sensor comprises a plurality of via chains, and the detecting the interface include detecting and comparing continuity/discontinuity of respective ones of the plurality of via chains.

17. The method of claim 16, wherein the defect comprise a delamination.

18. The method of claim 16, wherein:
    the semiconductor structure comprises a plurality of layers of dielectric material, and
    the two respective layers are included in the plurality of layers of dielectric material.

19. The method of claim 18, wherein the dielectric material comprises low-k dielectric material.

* * * * *